US010346974B2

(12) United States Patent
Sloan et al.

(10) Patent No.: US 10,346,974 B2
(45) Date of Patent: Jul. 9, 2019

(54) APPARATUS AND METHOD FOR MEDICAL IMAGE PROCESSING

(71) Applicant: Toshiba Medical Systems Corporation, Otawara-shi (JP)

(72) Inventors: James Sloan, Edinburgh (GB); Keith Goatman, Edinburgh (GB)

(73) Assignee: TOSHIBA MEDICAL SYSTEMS CORPORATION, Otawara-shi (JP)

(*) Notice: Subject to any disclaimer, the term of this patent is extended or adjusted under 35 U.S.C. 154(b) by 0 days.

(21) Appl. No.: 15/598,934

(22) Filed: May 18, 2017

(65) Prior Publication Data
US 2018/0336677 A1  Nov. 22, 2018

(51) Int. Cl.
*G06K 9/00* (2006.01)
*G06T 7/00* (2017.01)

(52) U.S. Cl.
CPC .. *G06T 7/0012* (2013.01); *G06T 2207/10081* (2013.01); *G06T 2207/10088* (2013.01);
(Continued)

(58) Field of Classification Search
USPC .......................................................... 382/128
See application file for complete search history.

(56) References Cited

U.S. PATENT DOCUMENTS 5,973,681 A * 10/1999 Tanigawa ................ H04L 29/06
                                                           348/473
6,701,524 B1 * 3/2004 Okamura ............. H04N 7/0255
                                                           348/473
(Continued)

FOREIGN PATENT DOCUMENTS

JP    2007-14706 A    1/2007
JP    2008-73239 A    4/2008
(Continued)

OTHER PUBLICATIONS

Dhanya et al., "Simulation of Positron Emission Tomography Tumor Images using MRI and CT", International Journal of Engineering Research & Technology (IJERT), ISSN: 2278-0181, vol. 5, Issue 07, Jul. 2016, Retrieved from Internet on Aug. 7, 2018, From: URL<https://www.ijert.org/phocadownload/V5I7/IJERTV5IS070407.pdf>.*

(Continued)

*Primary Examiner* — Gregory F Cunningham
(74) *Attorney, Agent, or Firm* — Oblon, McClelland, Maier & Neustadt, L.L.P.

(57) ABSTRACT

There is provided an apparatus comprising processing circuitry configured to: receive first medical image data obtained using a first type of imaging procedure, wherein the first medical image data is representative of an anatomical region of a subject; and apply a simulator to perform a simulation process on the first medical image data to obtain simulated second medical image data, the simulated second medical image data having properties so as to simulate image data that is obtained using a second type of imaging procedure. The simulator comprises an image synthesizer that is trained in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

34 Claims, 8 Drawing Sheets

(52) U.S. Cl.
CPC .............. *G06T 2207/20081* (2013.01); *G06T 2207/20084* (2013.01)

(56) References Cited

U.S. PATENT DOCUMENTS

| | | |
|---|---|---|
| 2007/0098299 A1 | 5/2007 | Matsumoto |
| 2007/0201050 A1* | 8/2007 | Mochizuki ......... H04N 1/00408 358/1.1 |
| 2015/0016728 A1 | 1/2015 | Parthasarathy et al. |
| 2015/0146951 A1 | 5/2015 | Zagorchev et al. |
| 2015/0294445 A1 | 10/2015 | Sakaue |
| 2016/0093048 A1* | 3/2016 | Cheng ................. G06K 9/6289 382/131 |
| 2017/0200265 A1* | 7/2017 | Bhaskar ................ G06T 7/0006 |
| 2017/0365038 A1* | 12/2017 | Denton .................... G06T 5/00 |

FOREIGN PATENT DOCUMENTS

| | | |
|---|---|---|
| JP | 2015-514447 A | 5/2015 |
| JP | 2015-523874 A | 8/2015 |
| JP | 2015-205164 A | 11/2015 |

OTHER PUBLICATIONS

Ian J. Goodfellow, et al. "Generative Adversarial Nets," NIPS'14 Proceedings of the 27$^{th}$ international Conference on Neural Information Processing Systems, 2014, 9 pages.

Vasileios Sevetlidis, et al. "Whole image Synthesis Using a Deep Encoder-Decoder Network," Springer International Publishing AG, 2016, pp. 127-137.

Min Chen, et al. "Cross contrast multi-channel image registration using image synthesis for MR brain images," Medical Image Analysis, vol. 36, 2017, pp. 2-14.

\* cited by examiner

APPARATUS AND METHOD FOR MEDICAL IMAGE PROCESSING

FIELD

Embodiments described herein relate generally to an apparatus and method for processing medical image data, for example an apparatus and method for using deep learning networks to simulate data of one modality or sequence from data of a different modality or sequence.

BACKGROUND

In medical imaging, different imaging modalities may be used to provide clinicians with complementary information. Complementary information may be information that is present in one acquisition but is not present in a different acquisition. Different sequences (for example, T1-weighted and T2-weighted sequences in magnetic resonance imaging) or different acquisition techniques (for example, contrast and non-contrast) may also be used to provide complementary information.

Examples of complementary information may include different physical parameters, anatomical information versus functional information, flow or perfusion, or soft tissue versus hard tissue contrast.

A given modality, sequence or acquisition technique may provide information that is not possible to obtain using a different modality, sequence or acquisition technique.

For example, a genuine T2-weighted magnetic resonance (MR) image cannot be obtained from a T1-weighted MR image, because there is not a monotonic relationship between the T1 and T2 relaxation times. An MR study may include the acquisition of both T1-weighted data and T2-weighted data, in order to obtain information that is only available in the T1-weighted data, and complementary information that is only available in the T2-weighted data.

Similar considerations may apply to data acquisition using more than one modality. For example, both CT (computed tomography) and MR data may be acquired in order to obtain hard tissue information from the CT data and complementary soft tissue information from the MR data.

BRIEF DESCRIPTION OF THE DRAWINGS

Embodiments are now described, by way of non-limiting example, and are illustrated in the following figures, in which.

DETAILED DESCRIPTION

Figure 1:
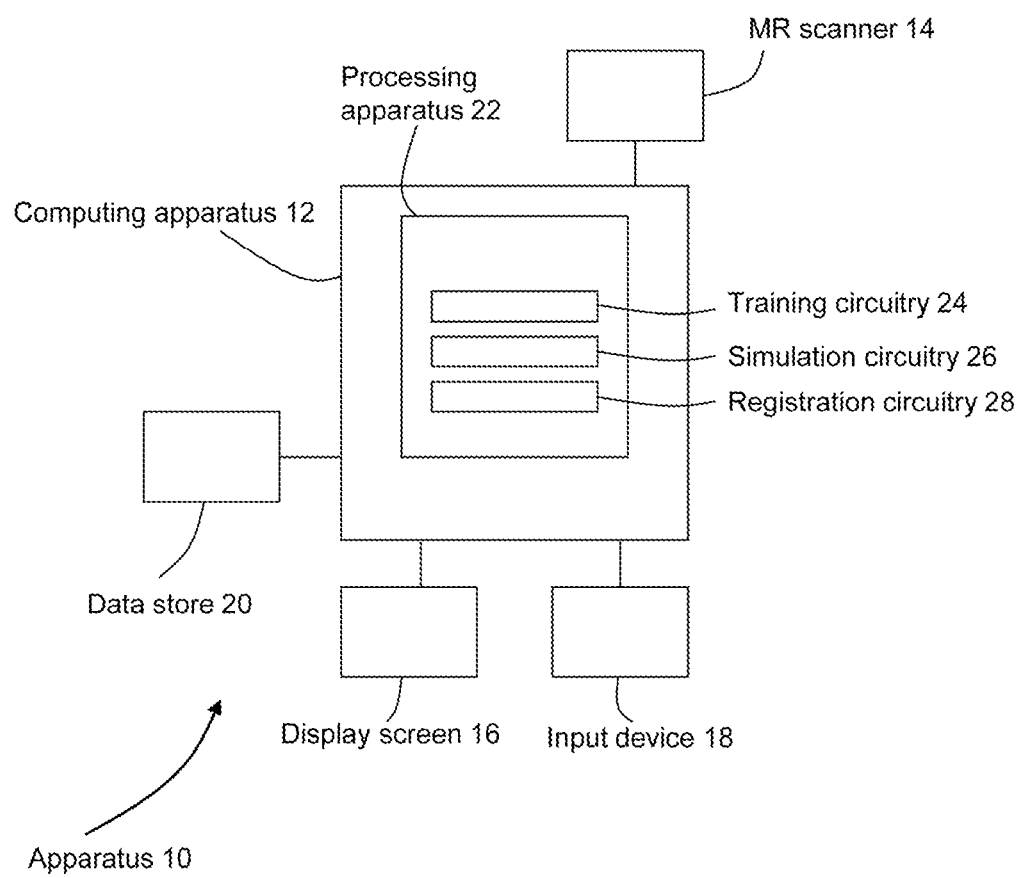
FIG. 1 is a schematic diagram of an apparatus according to an embodiment.

Certain embodiments provide an apparatus comprising processing circuitry configured to receive first medical image data obtained using a first type of imaging procedure, wherein the first medical image data is representative of an anatomical region of a subject; and apply a simulator to perform a simulation process on the first medical image data to obtain simulated second medical image data, the simulated second medical image data having properties so as to simulate image data that is obtained using a second type of imaging procedure. The simulator comprises an image synthesizer that is trained in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

Certain embodiments provide a method comprising receiving first medical image data obtained using a first type of imaging procedure, wherein the first medical image data is representative of an anatomical region of a subject; and applying a simulator to perform a simulation process on the first medical image data to obtain simulated second medical image data, the simulated second medical image data having properties so as to simulate image data that is obtained using a second type of imaging procedure. The simulator comprises an image synthesizer that is trained in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

Certain embodiments provide an apparatus comprising processing circuitry configured to receive a plurality of sets of training data, each set of training data comprising first training data obtained using a first type of imaging procedure and second training data obtained using a second type of imaging procedure, wherein the first and second training data are representative of the same anatomical region of the same subject; and use the sets of training data to train an image synthesizer in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

Certain embodiments provide an apparatus comprising processing circuitry configured to receive first medical image data obtained using a first type of imaging procedure, wherein the first medical image data is representative of an anatomical region of a subject; and apply an image converter to perform a conversion process on the first medical image data to obtain processed medical image data. The image converter comprises an image synthesizer that is trained in combination with a discriminator in an adversarial fashion by repeatedly alternating an image synthesizer training process in which the image synthesizer is trained to produce processed medical image data, and a discriminator training process in which the discriminator is trained to distinguish between real medical image data and processed medical image data.

An image data processing apparatus 10 according to an embodiment is illustrated schematically in FIG. 1. In the embodiment of FIG. 1, the apparatus 10 is configured to train a simulator for simulating images obtained using T2-weighted MR imaging from images obtained using T1-weighted MR imaging, and to use the trained simulator to simulate images obtained using T2-weighted MR imaging from images obtained using T1-weighted imaging. In other embodiments, a first apparatus may be used to train the simulator and a second, different apparatus may use the trained simulator to simulate images. In further embodiments, any apparatus or combinations of apparatuses may be used.

In further embodiments, the apparatus 10 may be used to train a simulator to simulate data obtained using any suitable type of imaging procedure, for example data obtained using any suitable modality, sequence, acquisition technique, or processing technique. The apparatus 10 or a further apparatus may receive an image obtained using any given first type of imaging procedure (for example, any given modality, sequence, acquisition technique or processing technique) and convert the received image into an image that appears to have been obtained using any given second type of imaging procedure (for example, any other modality, sequence, acquisition technique or processing technique).

The image data processing apparatus 10 comprises a computing apparatus 12, in this case a personal computer (PC) or workstation, which is connected to a magnetic resonance (MR) scanner 14, one or more display screens 16 and an input device or devices 18, such as a computer keyboard, mouse or trackball.

The MR scanner 14 may be any MR scanner that is configured to perform T1-weighted imaging. The MR scanner 14 is configured to generate T1-weighted imaging data that is representative of at least one anatomical region of a patient or other subject. In the present embodiment, the anatomical region is the brain. In other embodiments, any anatomical region may be imaged.

In further embodiments, the MR scanner may be configured to obtain any MR data, for example T2-weighted or diffusion-weighted imaging data.

In alternative embodiments, the MR scanner 14 may be replaced or supplemented by a scanner configured to obtain two-dimensional or three-dimensional imaging data in any other imaging modality, for example a CT (computed tomography) scanner, cone-beam CT scanner, X-ray scanner, ultrasound scanner, PET (positron emission tomography) scanner or SPECT (single photon emission computed tomography) scanner.

In the present embodiment, imaging data sets obtained by the MR scanner 14 are stored in data store 20 and subsequently provided to computing apparatus 12. In an alternative embodiment, imaging data sets are supplied from a remote data store (not shown) which may form part of a Picture Archiving and Communication System (PACS). The data store 20 or remote data store may comprise any suitable form of memory storage.

Computing apparatus 12 comprises a processing apparatus 22 for processing of data, including image data. The processing apparatus 22 provides a processing resource for automatically or semi-automatically processing imaging data sets. The processing apparatus comprises a central processing unit (CPU) and Graphical Processing Unit (GPU).

The processing apparatus 22 includes training circuitry 24 configured to train a simulator to simulate T2-weighted images from T1-weighted images, simulation circuitry 26 configured to use the trained simulator to simulate T2-weighted images from T1-weighted images, and registration circuitry 28 configured to register simulated T2-weighted images to real T2-weighted images. In the present embodiment, the training circuitry 24 is implemented on the GPU and the simulation circuitry 26 and registration circuitry 28 may be implemented on either the CPU or the GPU. In other embodiments, the training circuitry 24, simulation circuitry 26 and registration circuitry 28 may each be implemented in the CPU, in the GPU, or in a combination of the CPU and the GPU.

In the present embodiment, the circuitries 24, 26, 28 are each implemented in the CPU and/or GPU by means of a computer program having computer-readable instructions that are executable to perform the method of the embodiment. In other embodiments, the various circuitries may be implemented as one or more ASICs (application specific integrated circuits) or FPGAs (field programmable gate arrays).

The computing apparatus 12 also includes a hard drive and other components of a PC including RAM, ROM, a data bus, an operating system including various device drivers, and hardware devices including a graphics card. Such components are not shown in FIG. 1 for clarity.

Figure 2:
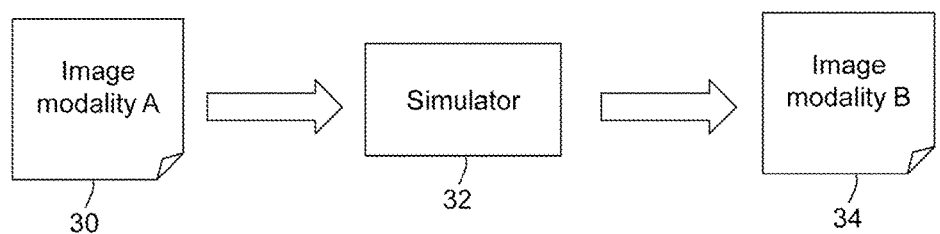
FIG. 2 is a flowchart illustrating in overview a simulation process.

FIG. 2 is a flow chart summarizing a simulation process. A simulator 32 receives a first set of medical image data that is representative of a first image 30. The first set of medical image data has been acquired using a first image modality A. The first set of image data may comprise a plurality of pixels with associated intensities, with each pixel being representative of a corresponding spatial location in the first image 30.

The simulator 32 processes the first set of image data representative of the first image 30 to obtain a second set of mage data that is representative of a second image 34. Although the second set of image data is obtained by processing image data that has been acquired using the first image modality A, the second set of image data has properties that are characteristic of a second image modality B. For example, the second set of image data may have intensity values, contrast values, signal-to-noise, resolution, sharpness or feature definition that are characteristic of the second image modality B. An appearance of the second set of image data may be such that the second image appears to a viewer to be data that was acquired using the second image modality B.

The second set of image data is in the same space (coordinate system) as the first set of image data. The second set of image data therefore represents the same anatomical region as the first set of image data. The second set of image data may be considered to simulate an image of the anatomical region that has been acquired using the second image modality B. The second set of image data may be referred to as simulated image data.

Figure 3:
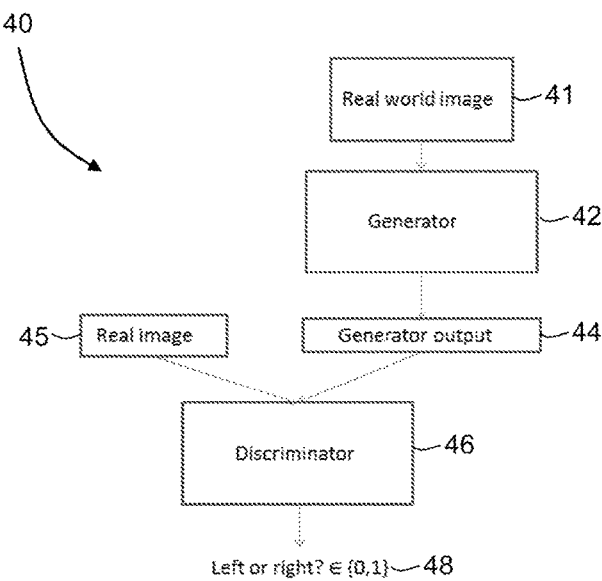
FIG. 3 is a schematic diagram of an adversarial network comprising a two-arm discriminator.

FIG. 3 is a schematic diagram representing a simulator 40 of the present embodiment. For simplicity, in the description below we refer to the simulator 40 receiving a first image and processing the first image to obtain a second, simulated image. However, in practice the simulator 40 receives a set of image data that is representative of the first image, and outputs a set of image data that is representative of the second, simulated image. In some embodiments, the image data is processed internally without corresponding images being displayed.

In further embodiments, the simulator may receive any suitable imaging data, which may not be directly representative of an image. For example, the simulator may receive any 2D or 3D imaging data that has been obtained from any suitable medical imaging scan. The imaging data may be representative of a whole image volume, or part of an image volume (for example, a slab). The imaging data may be pre-processed before it is provided to the simulator. For example, the imaging data may be segmented before it is provided to the simulator. The imaging data may be filtered, for example to reduce noise levels.

The simulator may process the imaging data to obtain imaging data that simulates imaging data obtained using a different type of imaging procedure. In some circumstances the simulated image data may then be rendered to obtain a simulated image.

In the present embodiment, the simulator 40 comprises an adversarial network, which may be referred to as a deterministic adversarial network (DAN). The deterministic adversarial network comprises two parts. A first part of the deterministic adversarial network is an image synthesizer 42, which may also be referred to as a generator, modality synthesizer or modality converter. The image synthesizer 42 comprises a first deep learning network. A second part of the deterministic adversarial network is a discriminator 46. The discriminator 46 comprises a second deep learning network.

A deep learning network may be a neural network that comprises stacked layers of neurons. The stacked layers of neurons may have non-linear activation functions that use the output of one or more previous layers as a subsequent layer's input. Deep learning models may construct highly non-linear mappings from an input space to an output space, and may thereby capture complex relationships of a process or task that is to be modeled.

In the present embodiment, each of the image synthesizer 42 and the discriminator 46 comprises a respective convolutional neural network. In other embodiments, any suitable type of deep learning network may be used, for example a multi-layer perceptron, a convolutional neural network with skip connections, a recurrent neural network.

The image synthesizer 42 is configured to accept a real world image 41 and to produce an output 44 which is a simulated image. In the present embodiment, the real world image 41 is a real T1-weighted image, and the output 44 is a simulated T2-weighted image.

The discriminator 46 is configured to receive a simulated image 44 from the image synthesizer 42 and a real image 45. This discriminator 46 is configured to produce a determination 48 of which of the images 44, 45 it judges to be real, and which of the images 44, 45 it judges to be fake (simulated). The discriminator will always classify one of the images 44, 45 as real and the other of the images 44, 45 as fake. The discriminator classifies as real the one of the images 44, 45 that it judges to have been obtained from a real T2-weighted imaging scan. The discriminator classifies as fake the one of the images 44, 45 that it judges not to have been obtained from a real T2-weighted imaging scan.

In the present embodiment, the simulated image is a simulated T2-weighted image that has been generated by the image synthesizer 42. The real image is a real T2-weighted image. Since the discriminator 46 has two inputs, it may be referred to as a 2-arm discriminator.

Figure 4:
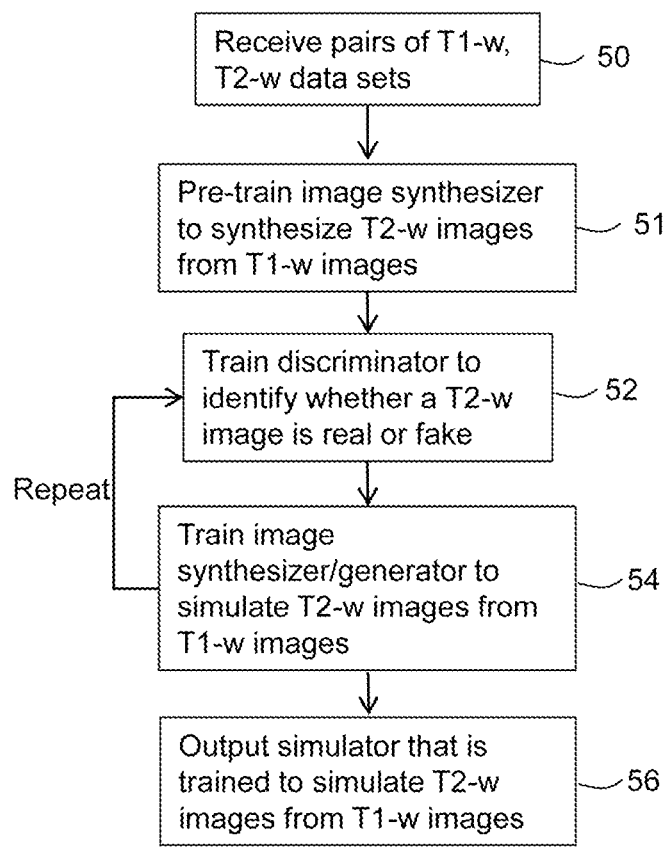
FIG. 4 is a flowchart illustrating in overview a training process according to an embodiment.

FIG. 4 is a flow chart illustrating in overview a method of training a simulator to simulate an image acquired using a second type of imaging procedure from an image acquired using a first type of imaging procedure. In the embodiment of FIG. 4, the first and second type of imaging procedure are different MR sequences. The first type is T1-weighted and the second type is T2-weighted. The simulator 40 is as described above with reference to FIG. 3.

In other embodiments, the first and second type of imaging procedure may be any suitable modalities, sequences, acquisition techniques or processing techniques.

At stage 50 of FIG. 4, the training circuitry 24 receives training data from the data store 20. In the present embodiment, the training data comprises or is obtained from sets of MR data that have been previously acquired by the MR scanner 14. In other embodiments, the training data may have been acquired by one or more further MR scanners.

The training data comprises a plurality of training data sets. Each training data set comprises a T1-weighted image and a corresponding T2-weighted image for the same anatomical region of the same subject. For example, each training data set may come from a study in which both T1-weighted data and T2-weighted data were acquired, for example a MR scan of a patient's brain comprising both T1-weighted and T2-weighted imaging.

In the present embodiment, 2000 training data sets are used in training the simulator 40. In other embodiments, any suitable number of training data sets may be used, for example hundreds or thousands of training data sets.

At stage 51 of the process of FIG. 4, the training circuitry 42 performs an image synthesizer pre-training process. The image synthesizer pre-training process comprises determining a set of weights for the deep learning network of the image synthesizer 42, which in this embodiment is a convolutional neural network.

The image synthesizer 42 is trained using the training data sets. For each of the training data sets, the image synthesizer 42 generates a simulated T2-weighted image from the T1-weighted image. The training circuitry 24 compares the simulated T2-weighted image to the real T2-weighted image.

The weights of the image synthesizer 42 are adjusted in dependence on an objective function. The objective function provides a measure of the difference between the simulated T2-weighted image and the real T2-weighted image. In the present embodiment, the objective function of this first component of the error is the mean squared error objective. In other embodiments, any suitable objective function may be used, for example Mean Absolute Error or Huber loss.

In other embodiments, any suitable pre-training of the image synthesizer 42 and/or discriminator 46 may be performed.

At stages 52 and 54 of the process of FIG. 4, the image synthesizer 42 and the discriminator 46 are trained repeatedly in an adversarial fashion. The discriminator 46 is trained to discriminate between real T2-weighted images and simulated T2-weighted images that have been simulated by the image synthesizer 42. The image synthesizer 42 is trained to simulate T2-weighted images that are similar enough to real T2-weighted images to fool the discriminator 46. By alternating optimization of the image synthesizer 42 with optimization of the discriminator 46, the image synthesizer 42 gets better at producing realistic simulated images, and the discriminator 48 gets better at distinguishing between real and simulated images. By training the image synthesizer 42 and discriminator 46 together in an adversarial function, better simulated images may be produced than if the image synthesizer 42 were to be trained alone.

Training deep learning networks in an adversarial fashion is discussed further in Goodfellow et al, Generative Adversarial Nets, NIPS '14 Proceedings of the 27th International Conference on Neural Information Processing Systems, pages 2672-2680, which is hereby incorporated by reference.

The training circuitry 26 alternates between training the discriminator 46 and training the image synthesizer 42 linked to the discriminator 48 on a batch-wise basis.

Turning to stages 52 and 54 of FIG. 4 in more detail, at stage 52 the training circuitry 24 performs a discriminator training process. The discriminator training process comprises determining a set of weights for the deep learning network of the discriminator, which in this embodiment is a convolutional neural network.

Training the discriminator 46 involves using real-world samples and samples that are created by the image synthesizer 42. In the present embodiment, the real-world samples are the T2-weighted images from the training data sets. The samples created by the image synthesizer 42 are simulated T2-weighted images that have been simulated by the image synthesizer 42 from the T1-weighted images from the training data sets.

For each of the training data sets, the discriminator receives the real T2-weighted image for that training data set and a simulated T2-weighted image that has been simulated from the T1-weighted image for that training data set. The discriminator attempts to determine which of the images is real and which is simulated.

Training the discriminator 46 involves minimizing an error signal of the discriminator 46. The error signal of the discriminator 46 is representative of the degree of success with which the discriminator 46 discriminates between real T2-weighted images and simulated T2-weighted images. The weights of the discriminator 46 are updated in response to the error signal of the discriminator 46.

In the present embodiment, the error function of the discriminator 46 is a binary cross entropy, which differs from the mean square error which may be used by some variational autoencoders.

At stage 54, the training circuitry 24 performs an image synthesizer training process. The image synthesizer training process comprises determining a set of weights for the deep learning network of the image synthesizer 42, which in this embodiment is a convolutional neural network.

The discriminator 46 is used in the training of the image synthesizer 42. While training the image synthesizer 42, the weights of the discriminator 48 are frozen so that only the weights of the image synthesizer 42 are updated. The output of the image synthesizer 42 is directly linked as input to the discriminator 48 to allow backpropagation of an error signal of the discriminator 46.

The image synthesizer 42 is trained using the training data sets. For each of the training data sets, the image synthesizer 42 generates a simulated T2-weighted image from the T1-weighted image. The training circuitry 24 compares the simulated T2-weighted image to the real T2-weighted image.

In the present embodiment, an error function E when training the image synthesizer 42 comprises two components.

The first component is an objective function which is minimized between the predicted and known values of the output of the image synthesizer 42. In this embodiment, the predicted value of the output is the simulated T2-weighted image. The known value of the output is the real T2-weighted image. The objective function provides a measure of the difference between the simulated T2-weighted image and the real T2-weighted image.

In the present embodiment, the objective function of this first component of the error is the mean squared error objective. In other embodiments, any objective function may be used, for example Mean Absolute Error or Huber loss. Any appropriate process may be used to minimize or reduce the objective function. In the present embodiment, the objective function used as the first component of the error function is the same objective function as is used in the pre-training stage 51. In other embodiments, different objective functions may be used.

The second component of the error function E is the error of the discriminator 46 which detects which of the given images is real and fake. Since the image synthesizer 42 is actively being trained to trick the discriminator 46 into believing the generated image is genuine, weights within the image synthesizer 42 are adjusted whilst training to maximize the error signal of the discriminator. In other embodiments, any appropriate process may be used to maximize or increase an error signal of the discriminator 48.

When training the image synthesizer 42, we are minimizing the mean squared error between the output of the image synthesizer 42 and known intensity values and also maximizing the error of the discriminator 46. Weights of the image synthesizer 42 are adjusted in response to the two components of the error function.

After training the image synthesizer 42 at stage 54, the flow chart returns to the stage 52 to train the discriminator again. Stages 52 and 54 are repeated until the method converges. The repetition of stages 52 and 54 may finish at either stage 52 or stage 54. The present embodiment comprises about 10000 alternating steps of training the discriminator 48 and image synthesizer 42. In other embodiments, any number of repetitions may be used.

In summary, to train the simulator 40, we alternate between training the discriminator 46 on output of the image synthesizer 42 and real world images, and freezing the discriminator's weights and training the entire simulator 40 and thus only updating the weights of the image synthesizer 42.

At stage 56 of FIG. 4, the training circuitry 24 outputs the trained simulator 40. In the present embodiment, the training circuitry 24 outputs both the trained image synthesizer 42 and the trained discriminator 46. In further embodiments, the training circuitry 24 outputs only the trained image synthesizer 42.

The trained simulator 40 is trained to convert a T1-weighted image into an image that has properties (for example, intensity, contrast and resolution) similar to that of a T2-weighted image. Since the simulator 40 is trained using deep learning, the properties that cause the simulated image to resemble a real image may not be known before the training process is started. The training of the simulator may comprise identifying not only values for properties used in simulation, but the properties themselves. In some circumstances, properties may be simulated without being explicitly identified.

Training the image synthesizer 42 and the discriminator 46 in an adversarial fashion may produce a better simulator 40 than if the image synthesizer 42 were to be trained alone without using the output from the discriminator. Using a deterministic adversarial network may provide simulated images that have good sharpness and detail. The sharpness and/or detail provided by the DAN may exceed that provided by some known systems, for example image synthesizers that are not trained in an adversarial fashion.

In the embodiment described above, the discriminator 46 is a two-arm discriminator. In other embodiments, the discriminator 46 is a one-arm discriminator. An example of a simulator with a one-arm discriminator is shown in FIG. 5.

Figure 5:
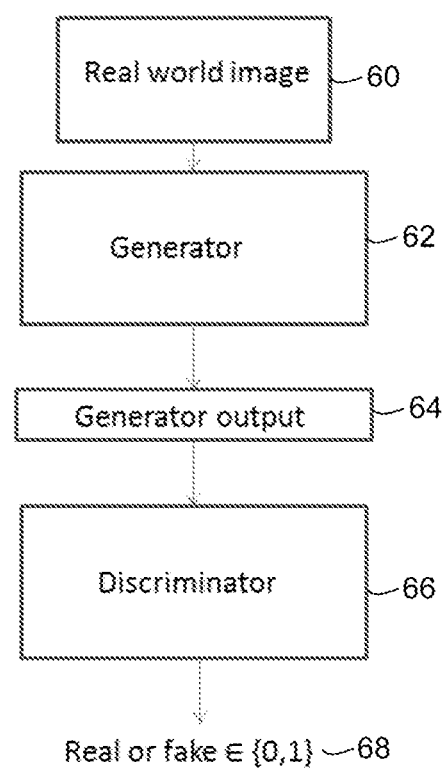
FIG. 5 is a schematic diagram of an adversarial network comprising a one-arm discriminator.

The simulator of FIG. 5 comprises an image synthesizer or generator 62 which may be similar to the image synthesizer 42 of FIG. 3. For example, the image synthesizer 62 of FIG. 5 may comprise a convolutional neural network. The image synthesizer 62 is configured to receive a real world image 60 and produce an output 64 comprising a simulated image of a different modality or sequence.

The simulator of FIG. 5 further comprises a discriminator 66. The discriminator 66 of FIG. 5 differs from the discriminator 46 of FIG. 3 in that it receives only the output 64 of the image synthesizer 62 (which comprises a simulated image), and does not receive a real image. The discriminator 66 determines whether the single image that it has received is real or fake and outputs its determination 68.

The two-arm discriminator 46 may be referred to as a two-channel discriminator. The one-arm discriminator 66 may be referred to as a one-channel discriminator.

In some circumstances, the two-arm discriminator may be a better discriminator than a one-arm discriminator. The two-arm discriminator directly compares two images to predict which is real and which is fake, instead of operating on a single image.

In other embodiments, any suitable multi-arm discriminator (which may also be described as a multi-channel discriminator) may be used, for example a two-arm, three-arm, five-arm or ten-arm discriminator. Each multi-arm discriminator may compare one fake (simulated) image to one or more real images. For example, the discriminator may have 10 arms, where 9 of the images are real and one is fake and the discriminator tries to guess which one is fake.

Figure 6:
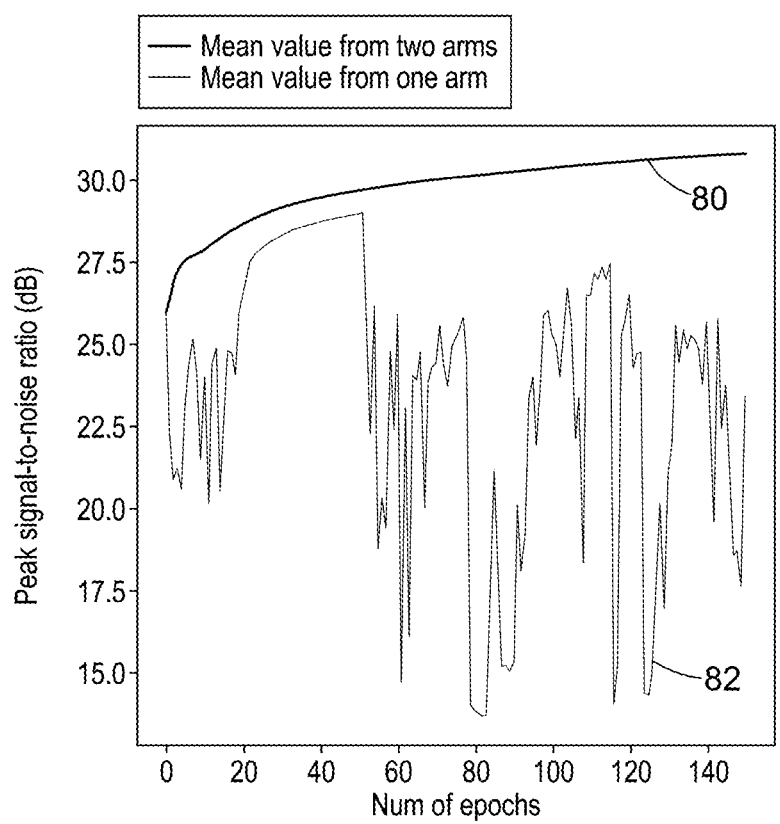
FIG. 6 is a plot of peak signal-to-noise ratio versus number of epochs for a single-arm discriminator and a two-arm discriminator.

FIG. 6 compares the two-arm methodology of FIG. 3 to the one-arm methodology of FIG. 5. FIG. 6 shows the mean peak signal-to-noise ratio on a test set of 500 Images as each of two discriminators (a single-arm discriminator and a multi-channel discriminator, which in this example is a two-arm discriminator) is used to train an autoencoder. Mean peak signal-to-noise ratio is plotted against a number of epochs over which the discriminator is trained. As can be seen from FIG. 6, the multi-channel discriminator method (shown in FIG. 6 as line 80) has a mean peak signal-to-noise ratio that monotonically increases over the training phase, while the single-arm discriminator method (shown in FIG. 6 as line 82) may be considered to have an almost stochastic optimization. For this example, the multi-channel discriminator has considerably better convergence properties than the single-arm discriminator.

In some embodiments, a simulator 40 comprising a two-arm discriminator 46 may converge more quickly than a simulator comprising a one-arm discriminator. In some embodiments, the two-arm discriminator may be trained using a smaller amount of training data than is used to train a one-arm discriminator. In some circumstances, the two-arm discriminator may have better performance than a one-arm discriminator.

Figure 7:
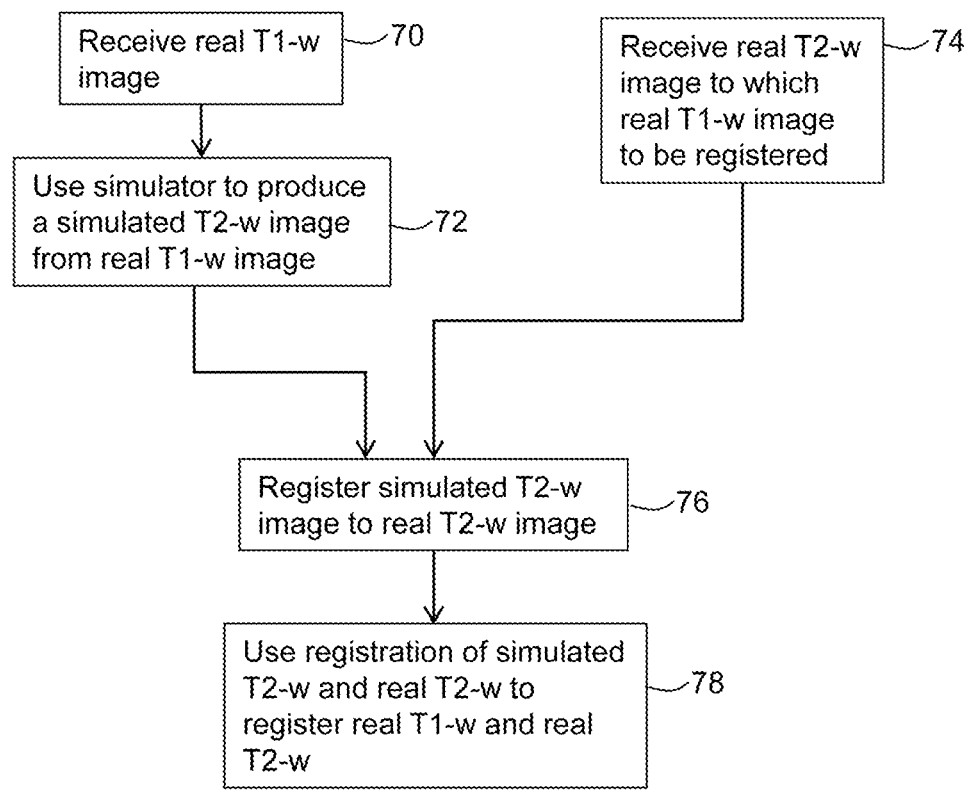
FIG. 7 is a flow chart illustrating in overview a simulation and registration process according to an embodiment.

FIG. 7 is a flow chart illustrating in overview a process in which the simulator 40 is used to generate a simulated T2-weighted image from a real T1-weighted image. A registration is then performed using the simulated T2-weighted image.

Before the process of FIG. 7 begins, the simulator 40 is trained to simulate T2-weighted images using a training method as described above with reference to FIG. 4.

At stage 70 of FIG. 7, the simulation circuitry 26 obtains a T1-weighted image. At stage 72, the simulation circuitry 26 uses the simulator 40 to simulate a T2-weighted image from the T1-weighted image. The simulation circuitry 26 passes the simulated T2-weighted image to the registration circuitry 28.

The simulated T2-weighted image has properties that are characteristic of a T2-weighted image. For example, regions of water may appear bright in the simulated T2-weighted image, while they appear dark in the T1-weighted image. The simulated T2-weighted image may resemble a real T2-weighted image in its image properties. For example, it may be similar to a real T2-weighted image in intensity values, intensity range, contrast, resolution, sharpness, feature definition and/or signal-to-noise levels.

In an example, a set of four images are generated that demonstrate the ability of the simulator to synthesize T2-weighted images from T1-weighted input images. In this example, the first image is an image of a T1-weighted MR axial brain image slice. The second image is an image of a genuine T2-weighted image that matches the T1-weighted first image. For example, the T2-weighted image may be a T2-weighted image that is acquired in the same study as the T1-weighted first image.

The third image is a simulated T2-weighted image that is obtained from the T1-weighted first image by using an image synthesizer comprising a stacked autoencoder. The fourth image is a simulated T2-weighted image that is obtained from the T1-weighted first image by using a DAN simulator that is trained as described above with reference to FIG. 3. In each of the methods used to produce the third and fourth images, the image synthesizer comprises a stacked autoencoder. Only the method used to produce the fourth image uses a discriminator. In this example, the fourth image (using the DAN method) is sharper than the third image (using the stacked autoencoder).

It should be noted that a simulated T2-weighted image obtained from a T1-weighted image may differ from a real T2-weighted image obtained in the same scan as the T1-weighted image. Although the simulator 40 is trained to produce realistic simulated images, as explained above there will be information in the real T2-weighted image that is not available in the T1-weighted image. Nevertheless, the simulated T2-weighted image may be a useful tool for multi-sequence registration as described below, or for other applications which are also described below. By using a simulated T2-weighted image, operations may be performed on that simulated T2-weighted image that it may not be possible to perform on the original T1-weighted image from which the simulated T2-weighted image was obtained.

At stage 74, the registration circuitry 28 receives a real T2-weighted image to which the T1-weighted image received at stage 70 is intended to be registered. For example, the T1-weighted and T2-weighted image may be obtained from the same scan but may not be well enough registered for use in a desired application. In another example, the T1-weighted image and real T2-weighted image may be from scans of the same patient that were acquired at different times. Only T1-weighted data may be acquired in one scan (for example, an initial scan), and only T2-weighted data may be acquired in another scan (for example, a follow-up scan) and it may be intended to register the images obtained from each of the scans.

At stage 76, the registration circuitry 28 registers the simulated T2-weighted image that was obtained at stage 72 to the real T2-weighted image received at stage 74. In the present embodiment, the registration circuitry 28 registers the simulated T2-weighted image to the real T2-weighted image using a sum of squared difference similarity metric. In other embodiments, any suitable similarity metric may be used. The registration method may be any registration method that may be used to register images obtained using the same imaging procedure, for example images acquired using the same modality and sequence.

It is possible to register together the simulated T2-weighted image and real T2-weighted image using a registration method that may normally be used to register data acquired using the same type of imaging procedure because the simulated T2-weighted image has image properties that are similar to those of a real T2-weighted image.

At stage 78, the registration circuitry 28 uses the registration between the simulated T2-weighted image and the real T2-weighted image to obtain a registration between the T1-weighted image and the real T2-weighted image. Because the simulated T2-weighted image is in the same coordinate space as the T1-weighted image, the result of the registration of the simulated T2-weighted image and the real T2-weighted image may be transferred directly to the T1-weighted image.

In summary, a real T1-weighted image (stage 70) is registered to a real T2-weighted image (stage 74) by simulating a T2-weighted image from the real T1-weighted image and registering the simulated T2-weighted image to the real T2-weighted image.

In other embodiments, a method as described above with reference to FIG. 7 is used to assist any multimodality or multi-sequence image registration. For example, to register a T1-weighted to a CT image, one may first make the CT image look like a T1-weighted image.

It is known to use methods that directly register an image acquired using a first type of imaging procedure to an image acquired using a second, different type of imaging procedure, for example an image acquired using a different modality, sequence, acquisition technique or processing technique. For example, mutual information may be used to register images acquired using different types of imaging procedure.

However, the number of available registration methods that can be used to register images acquired using different types of imaging procedure may be far fewer than the number of registration methods than can be used to register images acquired using the same imaging procedure. IN some circumstances, registration methods that are used to register images acquired using the same imaging procedure may be more accurate than registration methods that are used to directly register an image acquired using one type of imaging procedure to an image acquired using a different imaging procedure. In some circumstances, registration methods that are used to register images acquired using the same imaging procedure may be faster and/or less computationally expensive.

By simulating a T2-weighted image and registering that simulated T2-weighted image to a real T2-weighted image, a better registration may be obtained than if the T1-weighted image and real T2-weighted image were registered directly. By producing a simulated T2-weighted image, a registration is performed between two images that appear to be of the same modality and sequence (in this case, the simulated T2-weighted image and the real T2-weighted image) which may allow a registration method to be used that could not be used to register images having different modalities or sequences.

In one embodiment, an attempt is made to acquire both T1-weighted and T2-weighted data in a first scan, but only T1-weighted data is successfully obtained. It is intended to register T2-weighted data from another scan to the data from the first scan, but only T1-weighted data from the first scan is available. Using the method of FIG. 7 may allow a registration to be performed despite the T2-weighted data being missing from the first scan.

The method of FIG. 7 may improve the accuracy and robustness of multi-modality or multi-sequence registration.

The efficacy of a DAN-trained modality converter may be demonstrated by changing a T1-w to T2-w rigid registration task (which may be referred to as a multi-modality rigid registration task) to a synthesized T2-w to T2-w rigid registration task (which may be referred to as a mono-modality task) which can then use sum of squared differences.

In an experiment, 2D multi-sequence rigid registration was performed using two different methods. Using each method, 150 registrations of T2-weighted images to T1-weighted images were performed. The images were MR 256 voxel×256 voxel head images. T2-weighted slices were selected from a test data cohort and were rigidly distorted with respect to corresponding T1-weighted slices. The slices were rigidly distorted using transformation parameters that were randomly sampled from uniform distributions. Transformations were randomly drawn from a uniform random distribution of (−40°, 40°) for rotation and (−25, 25) pixels for x and y translations. The same 150 registration instances were used for each method.

In a first method, a reference algorithm was used to provide a reference approach. The reference approach comprise directly registering the T1-weighted and T2-weighted images using a normalized gradient field similarity metric with a particle swarm optimizer. Normalized gradient fields were used as a multi-modality similarity metric.

Figure 8A:
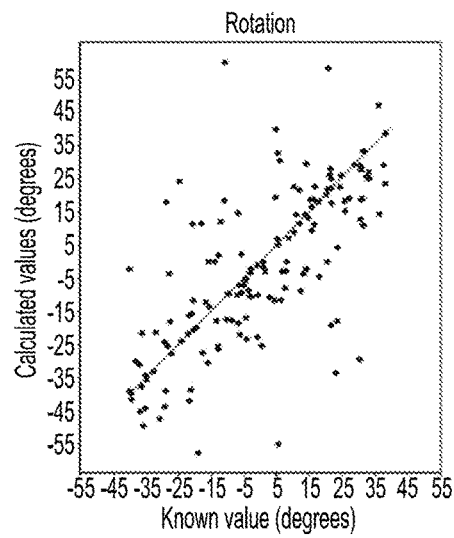
FIG. 8a is a plot of calculated rotation value against known rotation value for multimodal registration using Normalized Gradient Fields.

FIG. 8a plots values for rotation that were calculated using the first method against known rotation values. Each dot on the plot of FIG. 8a represents rotation values for a registration of a T2-weighted image to a T1-weighted image using the first method. The value on the x axis is a value for rotation that was randomly generated and used to offset the T1-weighted and T2-weighted images. The value on the y axis is the value for rotation that was calculated by registering the offset T2-weighted image and T1-weighted image using the first method. The better the registration, the nearer the value on the y axis will be to the value on the x axis.

Figure 8B:
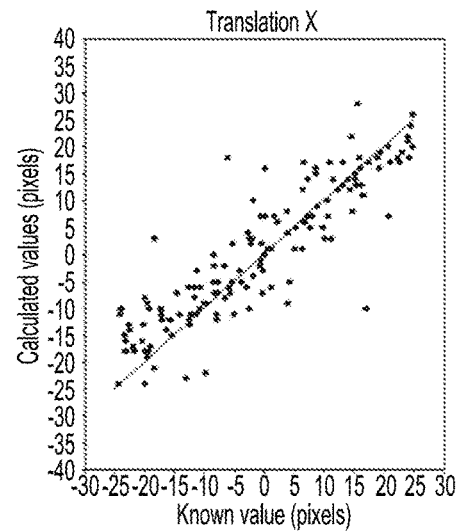
FIG. 8b is a plot of calculated x translation value against known x translation value for multimodal registration using Normalized Gradient Fields.
Figure 8C:
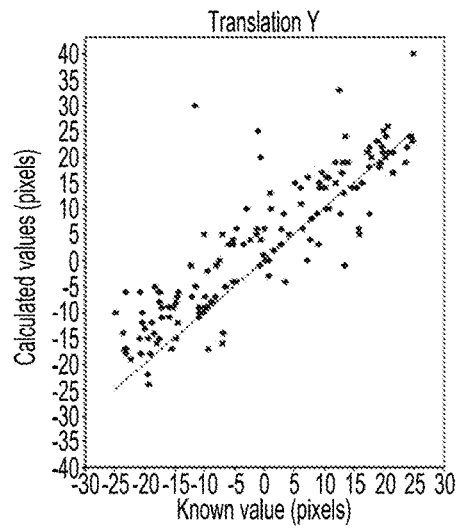
FIG. 8c is a plot of calculated y translation value against known y translation value for multimodal registration using Normalized Gradient Fields.

FIG. 8b plots values for translation in x that were calculated using the first method against known values for translation in x. FIG. 8c plots values for translation in y that were calculated using the first method against known values for translation in y.

It may be seen that in FIGS. 8a to 8c, there is a significant spread of values. Many of the calculated values for rotation or for x or y translation are quite different from the known values.

The second method was the method of FIG. 7, in which the T1-weighted image was converted to a simulated T2-weighted image using the discriminator-trained image synthesizer 42. This recast the T1-weighted to T2-weighted multi-modality registration into a synthesized T2-weighted to T2-weighted mono-modality problem, allowing a mono-modality registration method to be used. In the experiment, registration of the simulated T2-weighted image to the real T2-weighted image was performed using a sum of squared differences as the similarity metric and using particle swarm optimization. Particle swam optimization was used as the transformation model for each method to allow fair comparison between the methods.

For each method, values for rotation or translation obtained using the registration method were compared to the known transformation (which is the random transformation by which the T2-weighted slice had been distorted with respect to the T1-weighted slice).

Figure 9A:
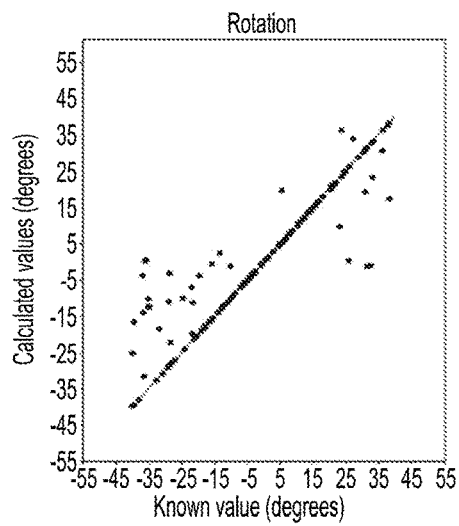
FIG. 9a is a plot of calculated rotation value against known rotation value for registration of synthesized T2-weighted images to real T2-weighted images using a sum of squared difference similarity measure.
Figure 9B:
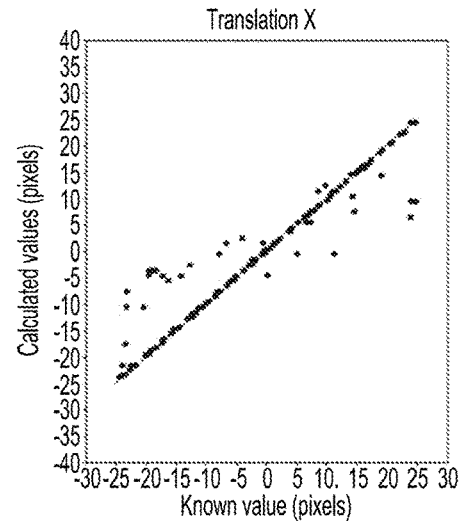
FIG. 9b is a plot of calculated x translation value against known x translation value for registration of synthesized T2-weighted images to real T2-weighted images using a sum of squared difference similarity measure.
Figure 9C:
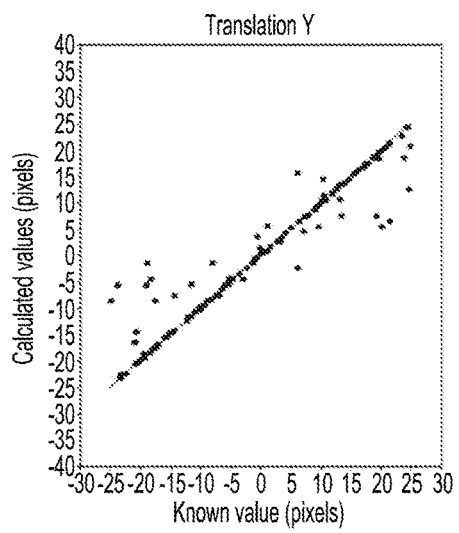
FIG. 9c is a plot of calculated y translation value against known y translation value for registration of synthesized T2-weighted images to real T2-weighted images using a sum of squared difference similarity measure.

FIG. 9a plots values for rotation that were calculated using the second method against known rotation values. FIG. 9b plots values for translation in x that were calculated using the first method against known values for translation in x. FIG. 9c plots values for translation in y that were calculated using the first method against known values for translation in y.

Table 1 below lists some results from the plots of FIGS. 8a to 9c. As the transformations used were known, errors could be examined on a per transformation basis.

TABLE 1

|  | Mean absolute error | Standard deviation | Median absolute error |
| --- | --- | --- | --- |
| FIG. 8a - rotation | 11.75 | 13.4 | 8.18 |
| FIG. 8b - translation in x | 4.76 | 4.56 | 3.92 |
| FIG. 8c - translation in y | 5.69 | 4.90 | 4.90 |
| FIG. 9a - rotation | 4.63 | 10.77 | 0.16 |
| FIG. 9b - translation in x | 2.00 | 4.15 | 0.26 |
| FIG. 9c - translation in y | 1.72 | 3.79 | 0.23 |

Using the second method, there is observed to be less dispersion and fewer outliers. The second method has a much lower median error than the first method. As may be observed in FIGS. 8a to 9c, the registration results from the modality converted T2-weighted to T2-weighted registration appear to recover the known deformations more accurately than the multi-modality T1-weighted to T2-weighted registration that is solved using normalized gradient fields as a similarity metric. The results in Table 1 confirm that the mono-modal approach s significantly more accurate than the multi-modality approach.

In the embodiment of FIG. 7, a T1-weighted image is registered with a T2-weighted image by creating a simulated T2-weighted image from the T1-weighted image. In other embodiments, any sequence may be simulated. For example, a T1-weighted image may be simulated from a T2-weighted image. In further embodiments, a different modality may be simulated. For example, to register a T1-weighted MR image to a CT image, one may use a simulator to make the CT image look like a T1-weighted image. A simulator may be trained to assist multimodality or multi-sequence image registration.

In further embodiments, a segmentation algorithm is available for data acquired using one type of imaging procedure, but the segmentation algorithm cannot be used with data that is acquired using a different type of imaging procedure. A simulator is trained to simulate the type of data for which the segmentation algorithm was developed. For example, in one embodiment a segmentation algorithm has been developed for CT images. A simulator is trained to process MR images to simulate CT images. The segmentation algorithm may then be used on an MR image by simulating a CT image from the MR image and applying the segmentation algorithm to the simulated CT image. By applying a simulation process as described above, segmentation algorithms that were developed for one modality may be used on other modalities.

In further embodiments, data is acquired using two different types of imaging procedure. For example T1-weighted and T2-weighted data may be acquired in a single scan of an anatomical region of a subject. Even though images acquired using both types of imaging procedure is available, an image acquired using one type of imaging procedure is used to simulate an image acquired using the other type of imaging procedure. The simulated image is then compared to the real image that was acquired using that type of imaging procedure.

For example, in some embodiments both T1-weighted and T2-weighted data is obtained in an MR acquisition, so both a real T1-weighted image and a real T2-weighted image are available. A simulator is trained as described above with reference FIG. 3 to simulate a T2-weighted image from the T1-weighted image. The simulated T2-weighted image is then compared to the real T2-weighted image.

There may be several motivations for comparing a simulated T2-weighted image to the real T2-weighted image for the same acquisition.

In some embodiments, comparing a simulated T2-weighted image to the real T2-weighted image for the same acquisition is used to identify an abnormality in the real T2-weighted image. The abnormality may be, for example, a pathology that is present in the anatomical region represented by the image.

The simulator may typically be trained using training data that comprises images that are free of pathology, which may be described as normal images. When applied to the acquired T1-weighted image, the simulator may produce a simulated T2-weighted image that appears to be free of pathology, since the simulator has been trained on normal images. If a pathology is in fact present, the real T2-weighted image may differ from the simulated T2-weighted image in accordance with that pathology. By comparing the simulated T2-weighted image to the real T2-weighted image, the pathology may be identified in the real T2-weighted image.

In some embodiments, comparing a simulated T2-weighted image to the real T2-weighted image for the same acquisition may be used to differentiate between benign and malignant brain lesions. In some embodiments, comparing a simulated T2-weighted image to the real T2-weighted image for the same acquisition may be used to detect areas of cerebral ischemia in early stroke detection.

In other embodiments, it is already known that an abnormality is present. For example, an abnormality may be present in the T2-weighted image. The simulator is used to simulate a normal image, for example a normal T2-weighted image. The simulated T2-weighted image is used to aid registration.

In some circumstances, it may be easier to register an image that appears to be normal than an image that contains abnormality. For example, some registration methods may be based on normal anatomy and may be more effective if the images that they are used on are representative of normal anatomy.

In some circumstances, it may be the case that a T2-weighted image that shows an abnormality is to be registered to a T2-weighted image in which the abnormality is not present. A better registration may be obtained by simulating a T2-weighted image without the abnormality, and registering that simulated T2-weighted image, than may be obtained by attempting to register the T2-weighted image having the abnormality. Similar considerations may apply to images acquired using other types of imaging procedure.

If a patient has suffered a massive stroke, the brain may look very different from how it looked before the stroke. Converting the post-stroke image to an image that appears to be normal may ease registration between images of pre- and post-stroke patients. In some circumstances, simulating a normal image may aid registration to a normal atlas.

In a further embodiment, T1-weighted and T2-weighted images are acquired in the same acquisition, but the T2-weighted image is noisy and/or corrupted. The simulator is used to simulate a T2-weighted image from the T1-weighted image. By comparing the real T2-weighted image with the simulated T2-weighted image, it may be possible to estimate or quantify image quality of the real T2-weighted image. For example, a noise level may be quantified. One or more artifacts may be identified in the real T2-weighted image.

Methods as described above, for example methods as described with reference to FIGS. 4 and 7, may be applied to any suitable types of imaging procedure, for example any imaging variant that generates images that appear different.

In some embodiments, a method similar to that of FIG. 7 is applied to pre- and post-contrast CT images, or to different contrasted CT images. Even within contrasted images, the image after injection at which the image is acquired may change the appearance of the image markedly.

In some embodiments, a method similar to that of FIG. 7 is applied to CT images that are acquired at different tube voltages, which changes the appearance of the image.

In some embodiments, a method similar to that of FIG. 7 is applied to any combination of MR sequences and/or to MR images using exogenous contrast agents.

In some embodiments, a method similar to that of FIG. 7 is applied to ultrasound images. Ultrasound may use contrast agents, and may have facilities such as harmonic imaging. Ultrasound may also have functional measurements, for example Doppler flow imaging and elastography.

In some embodiments, a method similar to that of FIG. 7 is applied to images acquired by nuclear medicine imaging (for example, PET). Nuclear medicine images may measure function. The appearance of nuclear medicine images may depend on the pharmaceutical tracer being used. A method similar to that of FIG. 7 may be used to simulate functional images from anatomical images (for example, MR or CT). A method similar to that of FIG. 7 may use an image obtained using one tracer to simulate an image acquired using a different tracer.

In some embodiments, different MR sequences may have been acquired in rapid succession, and may be fairly well aligned (although for some analyses an alignment method may be used to achieve an accuracy that is greater than a default alignment accuracy). However, alignment may be more important when a first image is taken using a first modality and scanner (for example, CT), and a second image sla taken using a different modality and scanner (for example MR), where the patient has had to be transferred between scanners.

In some embodiments, a method similar to that of FIG. 7 is used in distortion correction of diffusion-weighted MR images (DWI). DWI images may typically be acquired rapidly and may suffer non-rigid distortions. One way of correcting DWI images may registering the DWI acquisitions to a reference T1-weighted image, which may be less distorted. The registering of DWI images to a reference T1-weighted image may be performed using a method similar to that of FIG. 7.

In some embodiments, a method similar to that of FIG. 7 is used to register a pre-contrast image with a post-contrast image. Some known registration methods may shrink contrast areas to maximize similarity with a pre-contrast image. Using a method in which a pre-contrast image is simulated from a post-contrast image (or vice versa), may reduce or eliminate such shrinkage.

In some embodiments, a method similar to that of FIG. 7 is used to register an image to an atlas, for example to an atlas that was made from data acquired using a different modality or sequence.

In a further embodiment, a deterministic adversarial network is used to train an autoencoder to autoencode an image. In this embodiment, rather than synthesizing a different modality, the two-arm DAN is applied to a traditional autoencoder network.

The two-arm DAN configuration of FIG. 3 is used to autoencode T1-weighted sagittal brain images. In other embodiments, autoencoding of images acquired using any appropriate type of imaging procedure may be performed. In further embodiments, the DAN may be used to produce any appropriate alternative version of an image. For example, the DAN may be used to produce a compressed version of the image.

The discriminator is trained to distinguish between a real T1-weighted image and an autoencoded T1-weighted image. The image synthesizer is trained to produce autoencoded images that appear to the discriminator to be real images, because they have image properties that are characteristic of real T1-weighted images. Using an adversarial network to train an autoencoder may provide increased image sharpness when compared to an autoencoder in which an adversarial network is not used.

In an example, three images are generated. In this example, the first image is the real T1-weighted image that is used as input for the autoencoder. The second image shows results of a traditional autoencoder, which does not comprise a discriminator and is not trained in an adversarial fashion. The third image shows an autoencoder result trained within the two-arm DAN framework. In this example, the images demonstrate an ability of the DAN to preserve image sharpness, when compared with a simple autoencoder.

Certain embodiments provide a method for simulating the appearance of one medical imaging modality given another modality using a combination of a synthesizer and a discriminator, trained in combination in an adversarial fashion.

The discriminator may have a single channel, which receives its input directly from the synthesizer. The discriminator may have two channels, where one channel receives the output from the synthesizer and the other receives the true other modality image.

The system may be used to predict artifact-free images, for example to remove MR bias fields, CT metal artifacts etc. The predicted image may be a normal, pathology free image that can be used to detect the presence of disease. The resulting synthesized images may be used to assist multi-modality or multi-sequence registration. The resulting synthesized images maybe used to assist image segmentation.

Methods described above may be applied to any appropriate human or animal anatomy. Methods may be applied to the processing of image data obtained using any appropriate type of imaging procedure, for example any appropriate modality, sequence, acquisition type or processing technique. Image data acquired in one acquisition may be processed to simulate image data obtained in another acquisition. Methods may be applied to the analysis of images indicating function, for example tissue motion or liquid flow.

Whist particular circuitries have been described herein, in alternative embodiments functionality of one or more of these circuitries can be provided by a single processing resource or other component, or functionality provided by a single circuitry can be provided by two or more processing resources or other components in combination. Reference to a single circuitry encompasses multiple components providing the functionality of that circuitry, whether or not such components are remote from one another, and reference to multiple circuitries encompasses a single component providing the functionality of those circuitries.

Whilst certain embodiments have been described, these embodiments have been presented by way of example only, and are not intended to limit the scope of the invention. Indeed the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms and modifications as would fall within the scope of the invention.

The invention claimed is:

1. An apparatus comprising processing circuitry configured to:
   receive first medical image data obtained using a first type of imaging procedure, wherein the first medical image data is representative of an anatomical region of a subject; and
   apply a simulator to perform a simulation process on the first medical image data to obtain simulated second medical image data, the simulated second medical image data having properties so as to simulate image data that is obtained using a second type of imaging procedure;
   wherein the simulator comprises an image synthesizer that is trained in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

2. An apparatus according to claim 1, wherein at least one of the image synthesizer and the discriminator comprises a deep learning network.

3. An apparatus according to claim 2, wherein the deep learning network comprises at least one of: a convolutional neural network, a convolutional neural network with skip connections, a multi-layer perceptron, a recurrent neural network.

4. An apparatus according to claim 1, wherein the discriminator comprises a one-arm discriminator that is configured to receive a set of medical image data and to output a determination of whether the set of medical image data is real or simulated.

5. An apparatus according to claim 1, wherein the discriminator comprises a two-arm discriminator that is configured to receive two sets of medical image data comprising one set of real medical image data and one set of simulated medical image data, and to output a determination of which one of the two sets of medical image data is real and which one is simulated.

6. An apparatus according to claim 1, wherein the discriminator training process comprises:
   receiving a plurality of sets of training data obtained using the second type of imaging procedure;
   receiving a plurality of sets of simulated medical image data having properties so as to simulate image data obtained using the second type of imaging procedure; and
   training the discriminator to distinguish between the sets of training data and the sets of simulated medical image data.

7. An apparatus according to claim 1, wherein the discriminator training process comprises adjusting weights of the discriminator to minimize or reduce an error of the discriminator in distinguishing between real medical image data and simulated medical image data.

8. An apparatus according to claim 1, wherein the image synthesizer training process comprises:
   receiving a plurality of sets of training data, each set of training data comprising first training data obtained using the first type of imaging procedure and second training data obtained using the second type of imaging procedure, wherein the first and second training data are representative of the same anatomical region of the same subject; and
   for each set of training data,
      applying the image synthesizer to perform a simulation process on the first training data to obtain simulated data having properties so as to simulate image data that is obtained using the second type of imaging procedure;
      comparing the simulated data and the second training data; and
      applying the discriminator to the simulated data, the discriminator outputting a determination of whether it judges the simulated data to be real or simulated.

9. An apparatus according to claim 8, wherein comparing the simulated data and the second training data comprises determining a measure of difference between the second training data and the simulated data.

10. An apparatus according to claim 9, the image synthesizer training process further comprises, for each set of training data, determining an error of the discriminator in determining whether the simulated data is real or simulated.

11. An apparatus according to claim 10, wherein the image synthesizer training process comprises adjusting weights of the image synthesizer to minimize or reduce the measure of difference between the second training data and the simulated data while maximizing or increasing the error of the image synthesizer in determining whether the simulated data is real or simulated,
   thereby training the image synthesizer to produce simulated medical image data that is determined by the discriminator to be real medical image data.

12. An apparatus according to claim 1, wherein at least one of a) to c) occurs and wherein:
   a) the first type of imaging procedure uses a first modality and the second type of imaging procedure uses a second, different modality;
   b) the first type of imaging procedure uses a first sequence and the second type of imaging procedure uses a second, different sequence;

c) the first type of imaging procedure uses a first acquisition technique and the type of imaging procedure uses a second, different acquisition technique.

13. An apparatus according to claim 1, wherein the first type of imaging procedure uses one of T1-weighted MR imaging and T2-weighted MR imaging, and the second type of imaging procedure uses the other of T1-weighted MR imaging and T2-weighted MR imaging.

14. An apparatus according to claim 1, wherein the properties of the simulated second medical image data that simulate image data obtained using the second type of imaging procedure comprise at least one of: intensity values, contrast values, image resolution, sharpness, feature resolution, signal to noise levels.

15. An apparatus according to claim 1, wherein the processing circuitry is further configured to:
receive further medical image data obtained using the second type of imaging procedure; and
register the further medical image data and the simulated second medical image data.

16. An apparatus according to claim 15, wherein the registering of the further medical image data and the simulated second medical image data is performed using a registration method that is configured for registering two sets of medical image data that have been obtained using the same type of imaging procedure.

17. An apparatus according to claim 16, wherein the processing circuitry is further configured to obtain from the registration of the further medical image data and the simulated second medical image data a registration of the first medical image data and the further medical image data, thereby obtaining a registration of two sets of image data that have been obtained using different types of imaging procedure.

18. An apparatus according to claim 1, wherein the processing circuitry is further configured to segment the simulated second medical image data using a method configured for segmentation of data of the second type of imaging procedure, and to obtain from the segmenting of the simulated second medical image data a segmentation of the first medical image data.

19. An apparatus according to claim 1, wherein the processing circuitry is further configured to:
receive further medical image data obtained using the second type of imaging procedure, wherein the further medical image data is representative of the same anatomical region of the same subject as the first medical image data; and
compare the further medical image data and the simulated second medical image data.

20. An apparatus according to claim 19, wherein the further medical image data is obtained in the same scan as the first medical image data, the comparing of the further medical image data and the simulated second medical image data therefore comprising a comparing of real medical image data for that scan with simulated medical image data for that scan.

21. An apparatus according to claim 19, wherein the processing circuitry is further configured to identify the presence of at least one abnormality in the further medical imaging data in dependence on the comparing of the further medical image data and the simulated second medical image data.

22. An apparatus according to claim 19, wherein the processing circuitry is further configured to determine a measure of image quality of the further medical image data in dependence on the comparing of the further medical image data and the simulated second medical image data.

23. A method comprising:
receiving first medical image data obtained using a first type of imaging procedure, wherein the first medical image data is representative of an anatomical region of a subject; and
applying a simulator to perform a simulation process on the first medical image data to obtain simulated second medical image data, the simulated second medical image data having properties so as to simulate image data that is obtained using a second type of imaging procedure;
wherein the simulator comprises an image synthesizer that is trained in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

24. An apparatus comprising processing circuitry configured to:
receive a plurality of sets of training data, each set of training data comprising first training data obtained using a first type of imaging procedure and second training data obtained using a second type of imaging procedure, wherein the first and second training data are representative of the same anatomical region of the same subject; and
use the sets of training data to train an image synthesizer in combination with a discriminator in an adversarial fashion by repeatedly alternating an image synthesizer training process in which the image synthesizer is trained to produce simulated medical image data, and a discriminator training process in which the discriminator is trained to distinguish between real medical image data and simulated medical image data.

25. An apparatus comprising processing circuitry configured to:
receive first medical image data obtained using a first type of imaging procedure, wherein the first medical image data is representative of an anatomical region of a subject; and
apply an image converter to perform a conversion process on the first medical image data to obtain processed medical image data;
wherein the image converter comprises an image synthesizer that is trained in combination with a discriminator in an adversarial fashion by repeatedly alternating an image synthesizer training process in which the image synthesizer is trained to produce processed medical image data, and a discriminator training process in which the discriminator is trained to distinguish between real medical image data and processed medical image data.

26. An apparatus according to claim 25, wherein the image converter comprises an autoencoder, the conversion process comprises an autoencoding process, and the processed medical image data comprises autoencoded medical image data.

27. An apparatus according to claim 25, wherein the autoencoding process comprises at least one of compression, denoising.

28. An apparatus according to claim 13, wherein the simulator is configured to obtain simulated T2 weighted image data from real T1 weighted image; and the synthesizer is configured to be trained by using the discriminator training process in which the discriminator is trained to distinguish between real T2 weighted image data and the simulated T2 weighted image data.

29. An apparatus according to claim 28, wherein the processing circuitry is configured to compare the real T2 weighted image data with the simulated T2 weighted image data.

30. An apparatus according to claim 28, wherein the processing circuitry is configured to identify abnormality in the real T2 weighted image data.

31. An apparatus according to claim 28, wherein the processing circuitry is configured to perform a registration process using the real T2 weighted image data and the simulated T2 weighted image data.

32. An apparatus according to claim 28, wherein the processing circuitry is configured to denoise the real T2 weighted image data based on the simulated T2 weighted image data.

33. A training method of an image simulator, by using a discriminator, the image simulator being configured to perform a simulation process on input first medical image data to obtain simulated second medical image data, the first medical image data being obtained using a first type of imaging procedure, and the simulated second medical image data having properties so as to simulate image data that is obtained using a second type of imaging procedure, the method comprising:

performing an image simulator training process in which the image simulator is trained to produce simulated medical image data;

performing a discriminator training process in which the discriminator is trained to distinguish between real medial image data and simulated medical image data; and repeatedly alternating the image simulator training process and the discriminator training process.

34. A system comprising:

processing circuitry configured to receive first medical image data obtained using a first type of imaging procedure, wherein the first medical image data is representative of an anatomical region of a subject;

a discriminator; and a simulator configured to perform a simulation process on the first medical image data to obtain simulated second medical image data, the simulated second medical image data having properties so as to simulate image data that is obtained using a second type of imaging procedure, and configured to be trained in combination with the discriminator in an adversarial fashion by repeatedly alternating an image simulator training process in which the image simulator is trained to produce simulated medical image data, and a discriminator training process in which the discriminator is trained to distinguish between real medial image data and simulated medical image data.

* * * * *